United States Patent [19]
Jeong et al.

[11] Patent Number: 6,081,308
[45] Date of Patent: Jun. 27, 2000

[54] METHOD FOR MANUFACTURING LIQUID CRYSTAL DISPLAY

[75] Inventors: Chang-Oh Jeong, Incheon-si; Yang-Sun Kim, Kyungki-do; Myung-Koo Hur, Kyungki-do; Young-Jae Tak, Kyungki-do; Mun-Pyo Hong, Kyungki-do; Chi-Woo Kim, Seoul; Jueng-Gil Lee, Kyungki-do, all of Rep. of Korea

[73] Assignee: Samsung Electronics Co., Ltd., Suwon, Rep. of Korea

[21] Appl. No.: 09/031,445

[22] Filed: Feb. 26, 1998

Related U.S. Application Data

[63] Continuation-in-part of application No. 08/754,644, Nov. 21, 1996, Pat. No. 6,008,065.

[30] Foreign Application Priority Data

Feb. 26, 1997 [KR] Rep. of Korea ............ 97-5979
Sep. 19, 1997 [KR] Rep. of Korea ........... 97-47730

[51] Int. Cl.[7] ............ G02F 1/136; G02F 1/1343; H01L 29/04; H01L 23/48
[52] U.S. Cl. ............ 349/42; 349/46; 349/139; 349/147; 257/59; 257/72; 257/763; 438/30
[58] Field of Search .......... 257/59, 347, 72, 257/763, 764; 349/42, 46, 139, 147; 438/30

[56] References Cited

U.S. PATENT DOCUMENTS

| | | | |
|---|---|---|---|
| 3,893,945 | 7/1975 | Kobayashi et al. | 252/435 |
| 5,162,933 | 11/1992 | Kakuda et al. | 359/59 |
| 5,585,647 | 12/1996 | Nakajima et al. | 257/72 |
| 5,614,728 | 3/1997 | Akiyama | 257/57 |
| 5,621,556 | 4/1997 | Fulks et al. | 349/42 |
| 5,731,856 | 3/1998 | Kim et al. | 349/43 |
| 5,739,877 | 4/1998 | Onisawa et al. | 349/42 |
| 5,756,372 | 5/1998 | Wakui et al. | 438/30 |
| 5,821,622 | 10/1998 | Tsuji et al. | 257/763 |
| 5,844,647 | 12/1998 | Maruno et al. | 349/43 |
| 5,852,481 | 12/1998 | Hwang | 349/43 |
| 5,858,807 | 1/1999 | Kawamura | 438/30 |

*Primary Examiner*—Rodney Bovernick
*Assistant Examiner*—Tarifur R. Chowdhury
*Attorney, Agent, or Firm*—Jones Volentine, L.L.P.

[57] ABSTRACT

Since Mo or MoW layer can be deposited so as to give low stress to the substrate by adjusting the deposition pressure, a single Mo or MoW layer can be used as a wiring by itself of large scale and high resolution liquid crystal. The Mo or MoW layer has the low resistivity of less than 15 $\mu\Omega$cm and is etched to have a smooth taper angle using an Al etchant with Al or Al alloy. Therefore, it is possible to reduce the number of photolithography processes and to prevent a battery effect and generation of a hillock.

16 Claims, 19 Drawing Sheets

증착 압력

METHOD FOR MANUFACTURING LIQUID CRYSTAL DISPLAY

RELATED APPLICATIONS

This application is a continuation-in-part of U.S. patent application Ser. No. 08/754,644 filed on Nov. 21, 1996 now U.S. Pat. No. 6,008,065, which is hereby incorporated herein in its entirety by reference.

BACKGROUND OF THE INVENTION (1) Field of the Invention

The present invention relates to a method for manufacturing a liquid crystal display, and more particularly, to an improved method for manufacturing a thin film transistor liquid crystal display, in which the number of photolithography processes to be performed is reduced.

(2) Description of the Related Art

A thin film transistor LCD (which is referred to as TFTLCD, hereinafter) which uses the thin film transistor as the active device has various advantages such as low power consumption, low voltage drive, a thin type, lightweight, etc.

Since the thin film transistor (TFT) is significantly thinner than a conventional transistor, the process of manufacturing the same is complicated, thus productivity thereof is low and manufacturing costs are high. In particular, since a mask is used in every manufacturing step, at least seven masks are required. Therefore, various methods for increasing productivity of the TFT and lowering the manufacturing costs have been studied. In particular, a method for reducing the number of the masks used during the manufacturing process has been widely researched.

FIGS. 1 to 4 are sectional views for explaining the method for manufacturing an LCD according to a conventional technology as disclosed in U.S. Pat. No. 5,054,887.

In the drawings, reference characters A and B denote a TFT area and pad area, respectively.

Referring to FIG. 1, after forming a first metal film by depositing pure Al on a transparent substrate 2, gate patterns 4 and 4a are formed by performing a first photolithography on the first metal film. The gate patterns are used as a gate electrode 4 in the TFT area and as a gate pad 4a in the pad area.

Referring to FIG. 2, after forming a photoresist pattern (not shown) which covers a portion of the pad area by performing a general photolithography, an anodized film 6 is formed by oxidizing the first metal film using the photoresist pattern as an anti-oxidation film. At this time, the anodized film 6 is formed on the entire surface of the gate electrode 4 formed in the TFT area and on a portion of the gate pad 4a in the pad area.

Referring to FIG. 3, an insulating film 8 is formed by depositing, for example, a nitride film on the entire surface of the substrate 2 having the anodized film. Then, after forming a semiconductor film by subsequently depositing an amorphous silicon film 10 and an amorphous silicon film 12 doped with impurities on the entire surface of the substrate 2 on which the insulating film 8 is formed, a semiconductor film pattern 10 and 12 to be used as an active portion is formed in the TFT area by performing a third photolithography on the semiconductor film.

Referring to FIG. 4, a photoresist pattern (not shown) is formed which exposes a portion of the gate pad 4a formed in the pad area by performing a fourth photolithography on the entire surface of the substrate 2 on which the semiconductor film pattern is formed. Then, a contact hole which exposes a portion of the gate pad 4a is formed by etching the insulating film 8 using the photoresist pattern as a mask. Then, a source electrode 14a and a drain electrode 14b are formed in the TFT area by depositing a Cr film on the entire surface of the substrate having the contact hole and performing a fifth photolithography on the Cr film. In the pad area, a pad electrode 14c connected to the gate pad 4a through the contact hole is formed. At this time, the impurity doped-amorphous silicon film 12 on the upper portion of the gate electrode 4 formed in the TFT area during the photolithography process is partially etched, thus exposing a portion of the amorphous silicon film 10.

Referring to FIG. 5, a protection film 16 is formed by depositing an oxide film, on the entire surface of the substrate 2 on which the source electrode 14a, the drain electrode 14b and the pad electrode 14c are formed. Then, the contact hole which exposes a portion of the drain electrode 14b of the TFT area and that of the pad electrode 14c of the pad area is formed by performing a sixth photolithography on the protection film.

Subsequently, pixel electrodes 18 and 18a are formed by depositing indium tin oxide ITO which is a transparent conductive material on the entire surface of the substrate having the contact hole and performing a seventh photolithography on the ITO film. As a result, the drain electrode 14b and the pixel electrode 18 are connected in the TFT area and the pad electrode 14c and the pixel electrode 18a are connected in the pad area.

According to the conventional method for manufacturing the LCD, pure Al is used as the gate electrode material for lowering the resistance of a gate line. Therefore, an anodizing process is required to prevent a hillock caused by the Al, thus complicating the manufacturing process, reducing productivity, and increasing manufacturing costs.

SUMMARY OF THE INVENTION

It is an object of the present invention to provide an improved method for manufacturing a liquid crystal display in which manufacturing costs are reduced and productivity increased by reducing the number of photolithography processes performed.

It is another object of the present invention to provide a method for-manufacturing a liquid crystal display by which it is possible to prevent deterioration of device characteristics by preventing generation of an undercut in a gate electrode.

To achieve the above objects, there is provided an improved method for manufacturing a liquid crystal display according to the present invention, comprising the steps of forming a gate electrode and a gate pad by sequentially depositing a first metal film and a second metal film on a substrate of a TFT area and a pad area, respectively, by a first photolithography process, forming an insulating film on the entire surface of the substrate on which the gate electrode and the gate pad are formed, forming a semiconductor film pattern on the insulating film of the TFT are using a second photolithography process, forming a source electrode and a drain electrode composed of a third metal film in the TFT area using a third photolithography process, forming a protection film pattern which exposes a portion of the drain electrode and a portion of the gate pad on the substrate on which the source electrode and the drain electrode are formed using a fourth photolithography process, and forming a pixel electrode connected to the drain electrode and the gate pad on the substrate on which the protection film pattern is formed using a fifth photolithography process.

The first metal film is preferably formed of a material having a low resistivity lower than 15 Ωcm such as Al or Al alloy and the second metal film is preferably formed of a capping metal which is suitable for a pad such asone metal selected from the group consisting of Cr, Ta, Mo, Mo alloy and Ti.

The step of forming the gate electrode includes the steps of forming the first metal film and the second metal film on a substrate in the described order, forming a photoresist pattern on a portion of the second metal film, etching the second metal film using the photoresist pattern as a mask, reflowing the photoresist pattern, etching the first metal film using the reflowed photoresist pattern as a mask, and removing the reflowed photoresist pattern. At this time, the second metal film is overetched in the step of etching the second metal film to generate an undercut. The step of reflowing the photoresist pattern are performed in multiple steps.

The step of forming the gate electrode preferably includes the steps of forming the first metal film and the second metal film on the substrate in the described order, forming a photoresist pattern on a portion of the second metal film, etching the second metal film by dry etching using the photoresist pattern as a mask, and etching the first metal film. At this time, the second metal film is preferably wet or dry etched and the step of baking the photoresist pattern is preferably further comprised after the step of etching the second metal film.

The step of forming the gate electrode preferably includes the steps of forming the first metal film and the second metal film on a substrate, forming a photoresist pattern on a portion of the second metal film, etching the second metal-film using the photoresist pattern as a mask, etching the first metal film using the patterned second metal film, and re-etching the patterned second metal film. At this time, the step of baking the photoresist pattern is preferably further comprised prior to the step of etching the first metal film after etching the second metal film.

The step of forming the gate electrode preferably includes the steps of depositing the first metal film and the second metal film on a substrate in sequence, forming a photoresist pattern on a portion of the second metal film, etching the second metal film and the first metal film using the photoresist pattern as a mask in sequence under the same etch condition.

In this case, the first metal film is preferably formed of Al or Al alloy and the second metal film is preferably formed of Mo or Mo alloy In the case of using an aluminum alloy as the first metal film, it is preferable that the aluminum alloy consists of an aluminum and both/either a transition metal and/or a rare earth metal less than 5%.

In the case of using a Mo alloy as the second metal film, the Mo alloy is made of a MoW alloy comprising tungsten of 0.01 to less than 20 atm %, the rest of molybdenum and inevitable impurities. It is preferable to comprise 9 to 11 atm % tungsten.

In the case of wet etch as one etch condition, an etchant such as $CH_3COOH/HNO_3/H_3PO_4/H_2O$ can be used for etching the first metal film and the second metal film. It is preferable that the concentration of $HNO_3$ is 8 to 14%.

A single film of the above MoW alloy can be also used as a wiring, because it has a resistivity in the range of 12 to 14 $\mu\Omega$cm and is suitable for a pad.

The wiring of the single film can be used as a gate line or a data line of a display.

The method for manufacturing a TFT substrate for the liquid crystal display according to the present invention further comprises the steps of forming data pattern including a source electrode, a drain electrode and a data line. The data pattern may include a single film made from one material selected from a chromium, a molybdenum and a MoW alloy. Otherwise, they may have a dual-filmed structure which includes two films made of either two selected from a chromium, a molybdenum and a MoW alloy or MoW and either Al or Al alloy. When Al and Al alloy is used for an upper film, it is desirable to remove the portion of the aluminum film or the aluminum alloy film at a pad.

Also, a single layer of Mo or MoW may be used the signal line of the large scale and high resolution liquid display, because the Mo or MoW layer gives less stress to a substrate made of a material such as glass than other conductive layer.

According to the present invention, it is possible to prevent a battery effect and a hillock caused by directly contact of Al to the ITO by forming the gate electrode in a double structure of Al or an Al alloy and a refractory metal film. Also, it is possible to omit the anodizing process and to simultaneously etch the insulating film and the protection film due to a capping film, thus reducing the number of the photolithography processes. Also, since it is possible to form the first metal film larger than or identical to the second metal film, an undercut is not generated in the gate electrode. Therefore, it is possible to prevent the deterioration of insulation characteristics due to poor step coverage during deposition of the insulating film after forming the gate electrode. Also, since Mo or MoW layer can deposited so as to give low stress to the substrate by adjusting the deposition pressure, a single Mo or MoW layer can used as a wiring by itself of large scale and high resolution liquid crystal. The Mo or MoW layer has the low resistivity less than 15 $\mu\Omega$cm and is etched to have a smooth taper angle using an Al etchant with Al or Al alloy.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE PREFERRED EMBODIMENTS

Preferred embodiments of the present invention are described with reference to the accompanying drawings.

Figure 1:
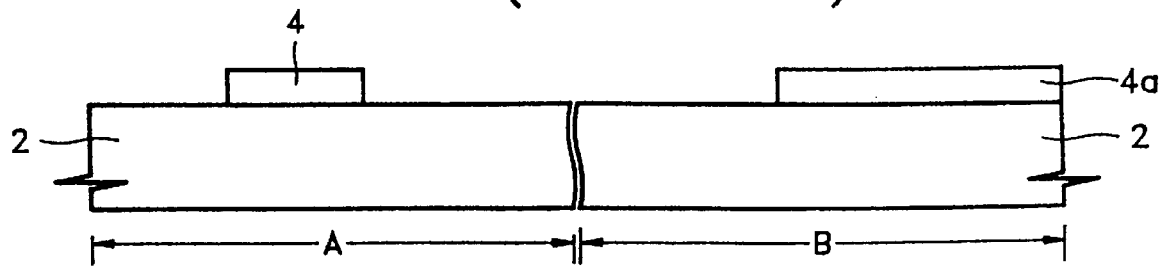
FIGS. 1 through 5 are sectional views for explaining a method for manufacturing liquid crystal display according to a conventional method.
Figure 2:
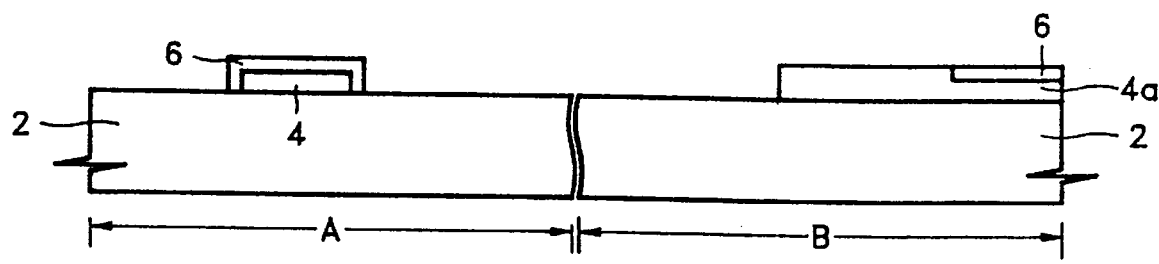
Figure 3:
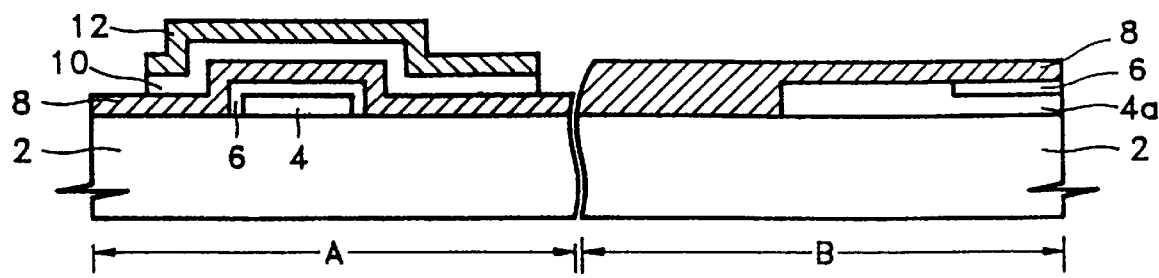
Figure 4:
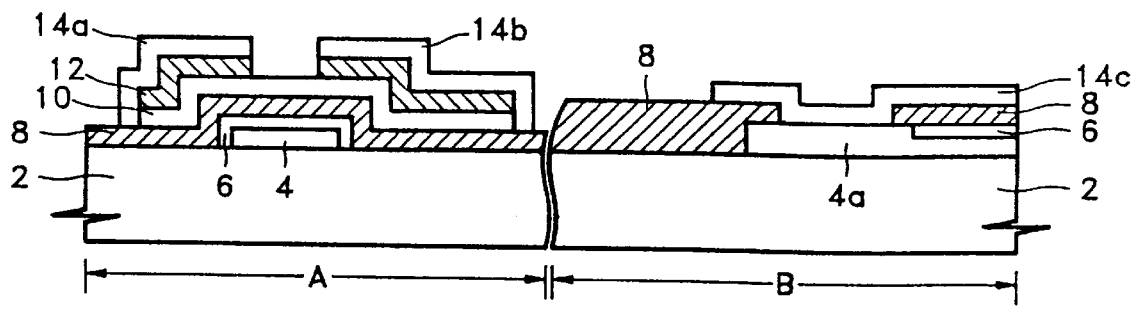
Figure 5:
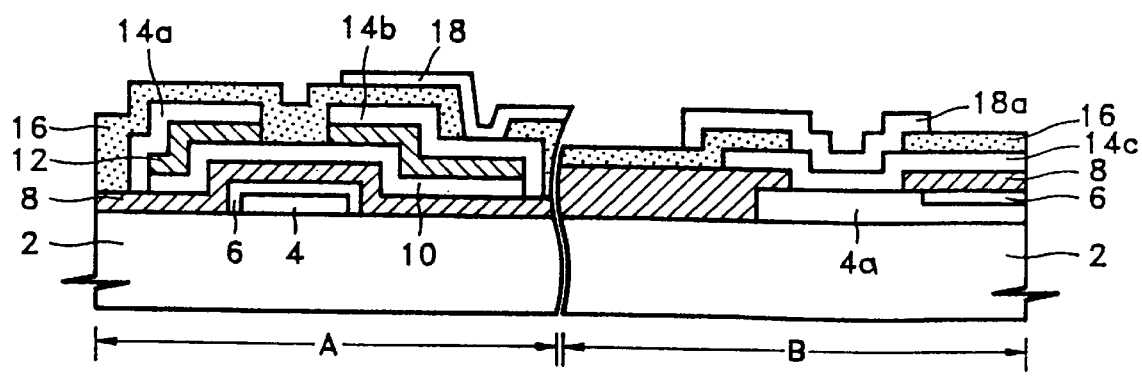
Figure 6:
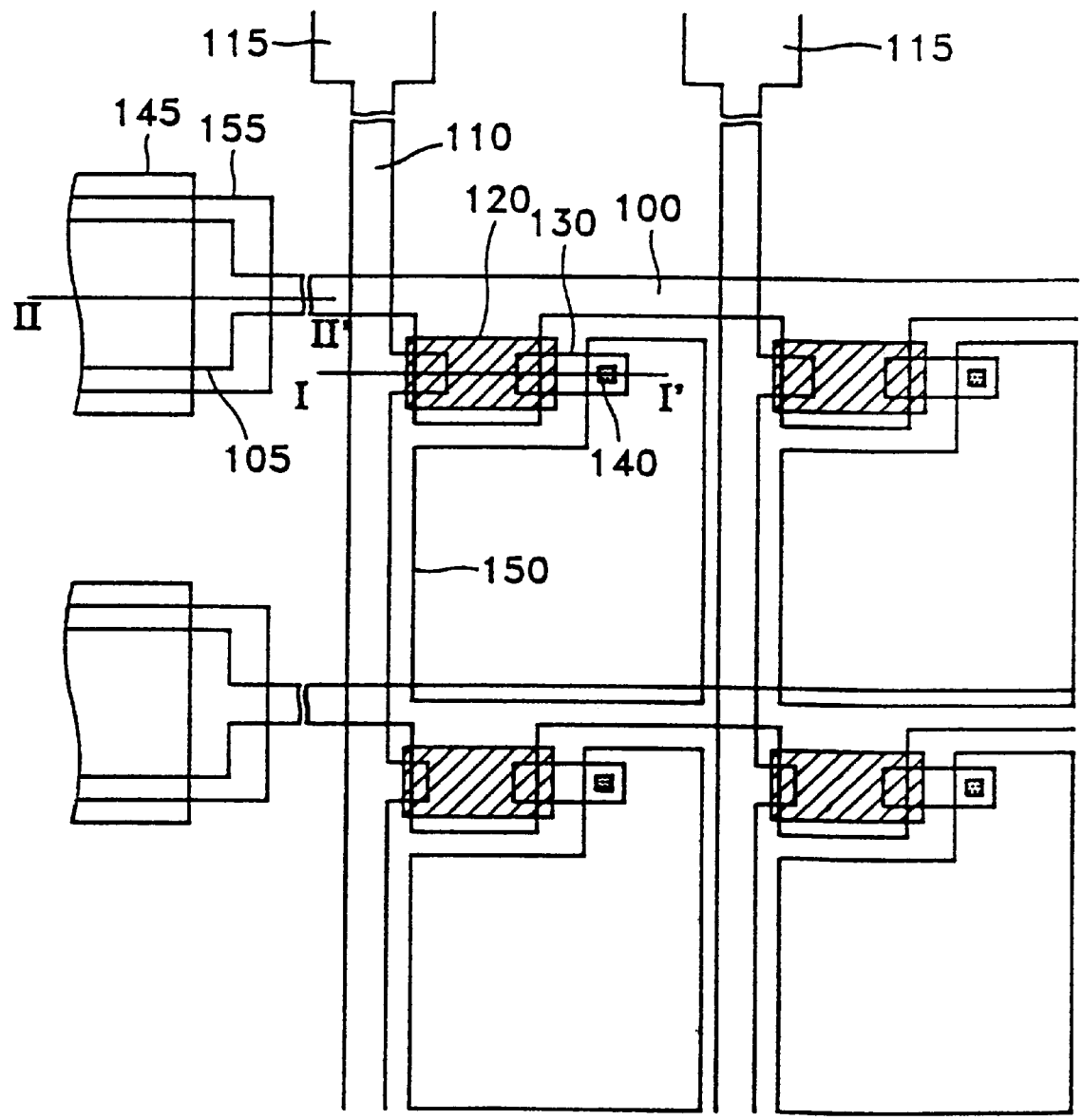
FIG. 6 is a schematic plan view of the mask patterns used for manufacturing a liquid crystal display according to the present invention.

FIG. 6 is a schematic plan view of the mask patterns used for manufacturing a liquid crystal display according to the present invention, in which reference numeral 100 denotes a mask pattern for forming a gateline, reference numeral 105 denotes a mask pattern for forming a gate pad, reference numeral 110 denotes a mask pattern for forming a data line, reference numeral 120 denotes a mask pattern for forming a semiconductor film, reference numeral 130 denotes a mask pattern for forming a source electrode/drain electrode, reference numeral 140 denotes a mask pattern for forming a contact hole for connecting a pixel electrode to the drain electrode in the TFT area, reference numeral 145 denotes a mask pattern for forming a contact hole for connecting a gate pad in the pad area to the pixel electrode, reference numeral 150 denotes a mask pattern for forming a pixel electrode in the TFT area, and reference numeral 155 denotes a mask pattern for forming a pixel electrode in the pad portion.

Referring to FIG. 6, the gate line 100 is horizontally arranged, the data line 110 is arranged in a matrix pattern perpendicular to the gate line, the gate pad 105 is provided at the end portion of the gate line 100, and the data pad 115 is provided at the end portion of the data line. Pixel portions are respectively arranged in the matrix pattern in the portion bounded by the two adjacent gate lines and the data line. The gate electrodes of the respective TFTs are formed so as to protrude to the pixel portions from the respective gate lines. The semiconductor film 120 is formed between the drain electrodes of the respective TFTs and the gate electrodes of the respective TFTs. The source electrodes of the TFTs are formed in protruding portions from the data line 110. The pixel electrodes 150 composed of the transparent ITO are formed in the respective pixel portions.

FIGS. 7 through 11 are sectional views for explaining a method for manufacturing a liquid crystal display according to a first embodiment of the present invention. Reference character C represents the TFT area, which is a sectional view taken along I–I' of FIG. 6 and reference character D represents the pad area, which is a sectional view taken along II–III of FIG. 6.

Figure 7:
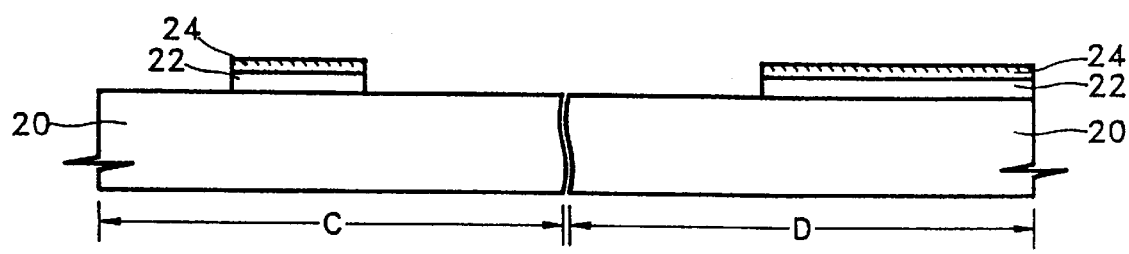
FIGS. 7 through 11 are sectional views for explaining a method for manufacturing a liquid crystal display according to a first embodiment of the present invention.

FIG. 7 shows the steps for forming the gate electrode, in which a first metal film 22 is formed by depositing an Al or an Al alloy film to a thickness of 2,000~4,000 Å on a transparent substrate 20. Then, a second metal film 24 is formed by depositing a refractory metal film to a thickness 500~2,000' A on the first metal film. Then, gate patterns are formed in the TFT area and the pad area by performing a first photolithography on the first and the second metal films 22 and 24. The gate patterns are used as a gate electrode in the TFT area and is used as a gate pad in the pad area. At this time, the first and the second metal films are wet or dry etched using a mask.

Here, the first metal film 22 is formed of Al or an Al alloy such as Al-Nd or Al-Ta. It is possible to lower the resistance of the gate line and to prevent generation of a hillock when the gate electrode is formed of the Al alloy. The second metal film 24, which is a capping film to prevent the Al alloy from contacting the ITO film to be formed in a subsequent process, is formed of one refractory metal selected from the group consisting of Cr, Ta, Mo, Mo alloy and Ti. Due to the capping film on the Al or Al alloy, a high temperature oxidation process and a photolithography process for forming an oxidized film are not required. Also, since the second metal film 24 does not include Al, a battery effect generated in the conventional technology is not generated even though the second metal film 24 directly contacts the ITO film to be formed in a subsequent process.

Figure 8:
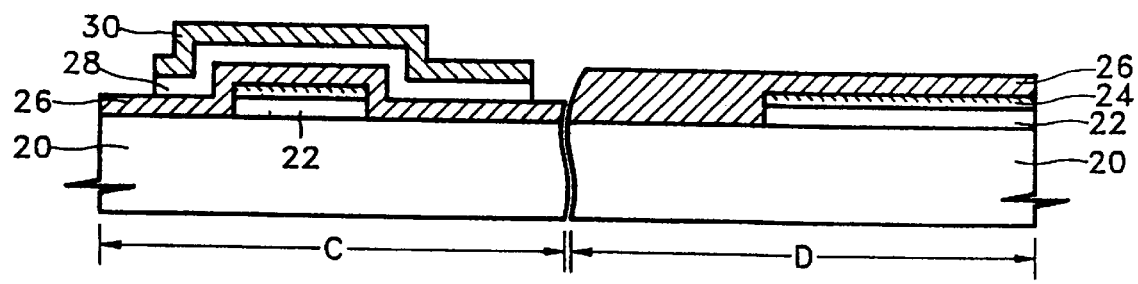

FIG. 8 shows the steps for forming a semiconductor film pattern, in which an insulating film 26 is formed by depositing a nitride film to a thickness of about 4,000 Å on the entire surface of the substrate on which a gate pattern is formed. Subsequently, a semiconductor film composed of an amorphous silicon film 28 and an impurity doped-amorphous silicon film 30 is formed to a thickness of 1,000~2,0000 A and a thickness of 5000 A on the insulating film 26. Then, the semiconductor film pattern to be used as an active area is formed in the TFT area by performing a second photolithography on the semiconductor film.

Figure 9:
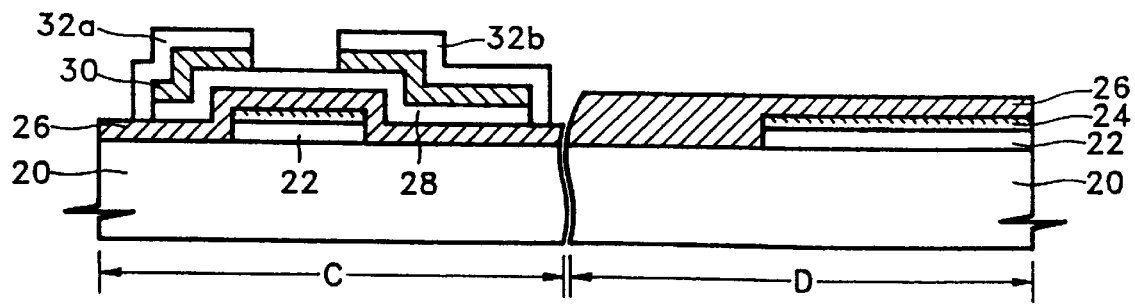

FIG. 9 shows the steps for forming a source electrode and a drain electrode. A third metal film is formed by depositing a Cr film to a thickness of 1,000~2,000' A on the entire surface of the substrate 20 on which the semiconductor film pattern is formed, by a sputtering method. Then, a source electrode 32a and a drain electrode 32b are formed in the TFT area by performing a third photolithography on the third metal film.

Figure 10:
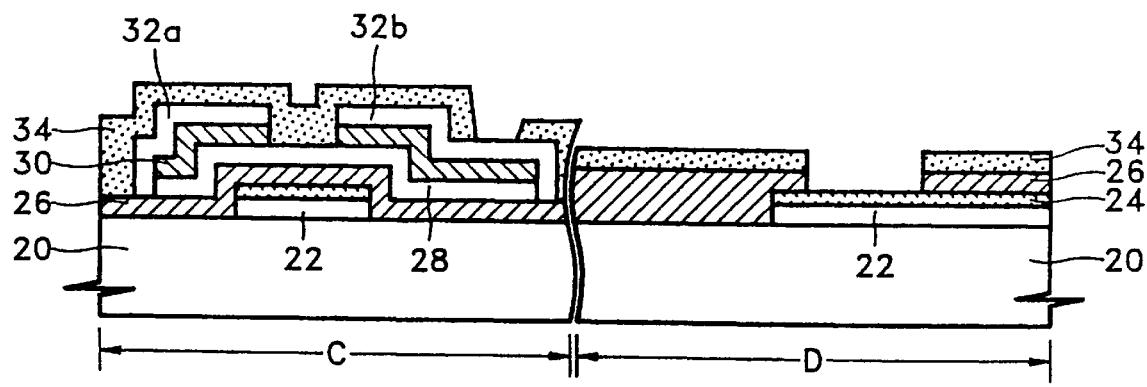

FIG. 10 shows the steps for forming a protection film pattern. The protection film is formed by depositing an insulating material e.g., an oxide film to a thickness of 1,000~3,000 Å on the entire surface of the substrate on which the source electrode 32a and the drain electrode 32b are formed. Then, a protection film pattern 34 which exposes a portion of the drain electrode 32b and a portion of the gate electrode 22 and 24 formed in the pad area, i.e., a gate pad is formed by performing a fourth photolithography on the protection film. In the pad area, the protection film 34 and the insulating film 26 which are formed on the gate pad are simultaneously etched.

Figure 11:
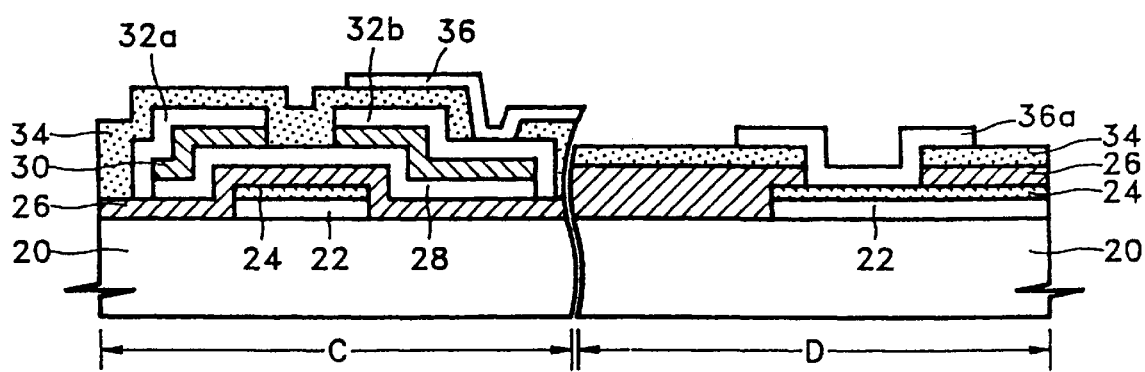

FIG. 11 shows the steps for forming a pixel electrode. After forming the ITO, film which is a transparent conductive film by a sputtering method on the entire surface of the substrate on which the protection film pattern is formed, pixel electrodes 36 and 36a are formed in the TFT area and the pad area by performing a fifth photolithography on the ITO film. As a result, the pixel electrode 36 and the drain electrode 32b are connected in the TFT area and the pixel electrode 36a and the gate pad 22 and 24 are connected in the pad area.

According to the method for forming a liquid crystal display according to a first embodiment of the present invention, a battery effect and an Al hillock caused by contact of the Al to the ITO is prevented by forming a gate electrode using an Al or Al alloy and forming the capping film on the gate electrode using a refractory metal. Also, it is possible to reduce the number of photolithography processes by omitting the anodizing process and simultaneously forming the contact on the insulating film and the protection film.

Figure 12:
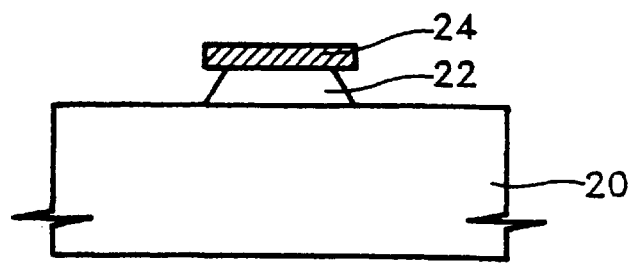
FIG. 12 is a sectional view showing generation of an undercut in a gate electrode.

The first metal film 22 and the second metal film 24 which constitute the gate electrode in the first embodiment of the present invention are etched using only one mask. Therefore, an undercut may be generated in the gate electrode as shown in FIG. 12. As a result, step coverage becomes poor in a subsequent insulating film depositing process, thus creating a risk of deteriorating insulation characteristics. In the second through fourth embodiments of the present invention, a method for preventing the generation of the undercut in the gate electrode is provided.

FIGS. 13 through 16 are sectional views for explaining a method for manufacturing a liquid crystal display according to a second embodiment of the present invention. Here, the initial steps through the step of forming the gate electrode are shown.

Figure 13:
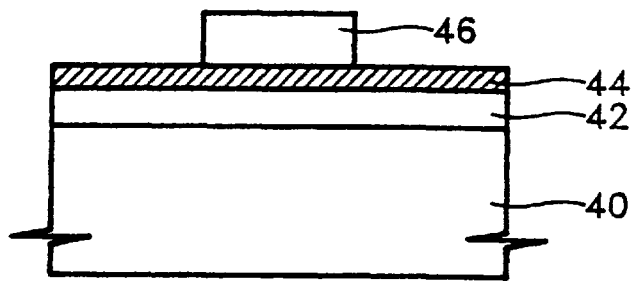
FIGS. 13 through 16 are sectional views for explaining a method for manufacturing a liquid crystal display according to a second embodiment of the present invention.

FIG. 13 shows the step of forming the conductive films for the gate electrode. First, a first metal film 42 is formed by depositing an Al or Al alloy film to a thickness of 2,000–4,000 Å on a transparent substrate 40. Then, a second metal film 44 to be used as a capping film is formed by depositing a refractory metal, such as Cr, Ta, Mo, Mo ally or Ti, preferably Cr or Mo alloy, on the first metal film 42. Here, Al-Nd or Al-Ta can be used as the Al alloy.

Figure 14:
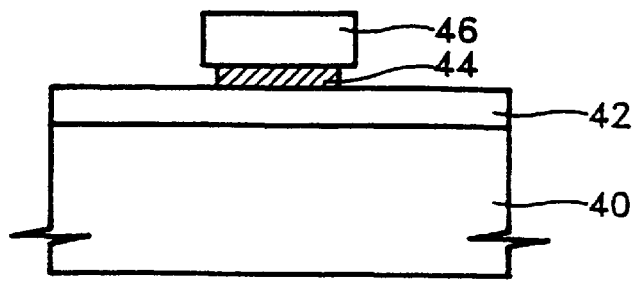

FIG. 14 shows the step of forming a photoresist pattern 46. A photoresist pattern 46 is formed by coating photoresist on the second metal film 44 and exposing and developing the photoresist. Then, a second metal film 44 is etched using the photoresist pattern 46 as a mask. At this time, an undercut is generated in the second metal film 44 by sufficiently overetching the second metal film.

Figure 15:
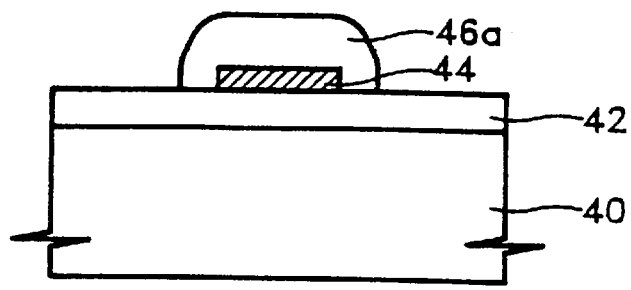

FIG. 15 shows the step of reflowing the photoresist. The substrate is heated to a temperature above 100° C. to reflow the photoresist. At this time, a heat treatment may be performed on the substrate over multiple steps in order to improve the reflow characteristic of the photoresist. As a result, the patterned second metal film 44 is completely covered by the reflowed photoresist 46a.

Figure 16:
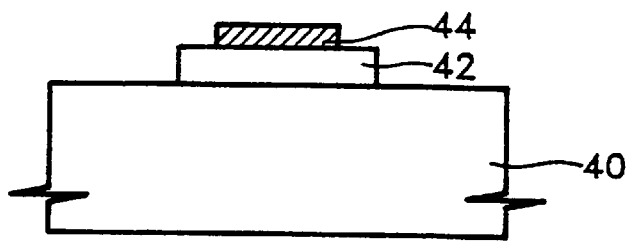

FIG. 16 shows the steps of forming the gate electrode. A photoresist pattern is removed after etching the first metal film 42 using the reflowed photoresist pattern 46a of FIG. 15 as a mask. As a result, since the first metal film 42 is etched to be wider than the second metal film 44 by the thickness of the photoresist 46a of FIG. 15, the step coverage of the insulating film is favorably formed in a subsequent insulating film depositing process. At this time, to prevent the first metal film 42 from contacting the ITO to be formed in a subsequent process, it is preferable to control the thickness and the size of the photoresist pattern so as to form the patterned second metal film 44 to be larger than the contact hole for connecting the ITO and the gate pad.

Since the following are identical to the above-described first embodiment, the explanation thereof is omitted.

Figure 17:
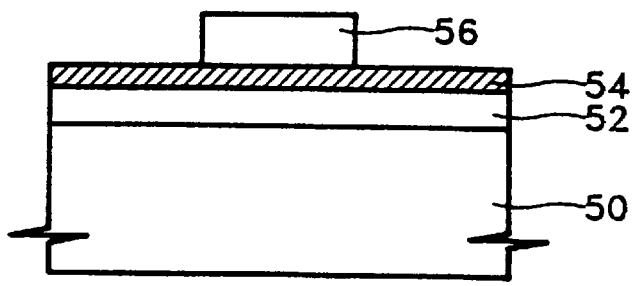
FIGS. 17 through 19 are sectional views for explaining a method for manufacturing a liquid crystal display according to a third embodiment of the present invention.
Figure 18:
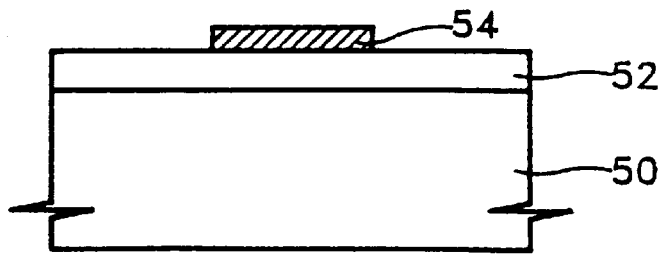
Figure 19:
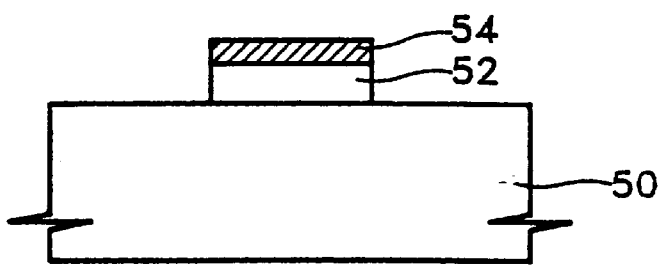

FIGS. 17 through 19 are sectional views for explaining a method for manufacturing a liquid crystal display according to a third embodiment of the present invention. Here, the initial steps through the step of forming the gate electrode are shown.

FIG. 17 shows the step of forming conductive films 52 and 54 for the gate electrode and a photoresist pattern 56, which is identical to the second embodiment in FIG. 13 of the present invention.

FIG. 18 shows the step of patterning the second metal film 54, in which the second metal film 54 is wet or dry etched using the photoresist pattern 56 of FIG. 17 as a mask. Then, the photoresist pattern is removed. The photoresist pattern is not necessarily removed in this step and may be removed after etching the first metal film 52.

In the case of wet etching the second metal film 54, an undercut may be generated to narrow the width of the first metal film to be etched later. At this time, if the photoresist pattern is not removed, baking may be performed on the photoresist pattern to prevent lifting of the photoresist pattern.

FIG. 19 shows the step of forming the gate electrode by etching the first metal film 52, in which the first metal film 52 is etched using the patterned second metal film 54 as a mask. Of course, in the case that the photoresist pattern is not removed in the previous step, the photoresist pattern can be used as a mask and the photoresist pattern is removed after etching the first metal film.

FIGS. 20 through 23 are sectional views for explaining a method for manufacturing a liquid crystal display according to a fourth embodiment of the present invention. Here, the initial steps through the step of forming the gate electrode are shown.

Figure 20:
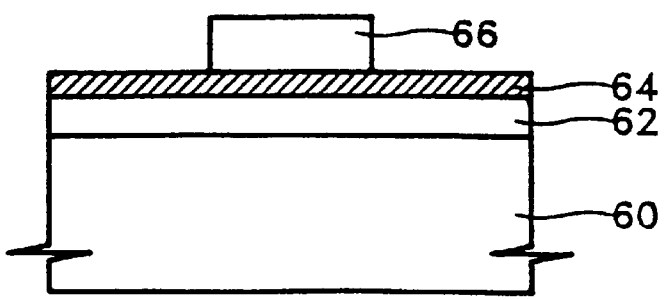
FIGS. 20 through 23 are sectional views for explaining a method for manufacturing a liquid crystal display according to a fourth embodiment of the present invention.

FIG. 20 shows the steps of forming conductive films 62 and 64 for the gate electrode and a photoresist pattern 66, which are identical to those of the second and the third embodiments.

Figure 21:
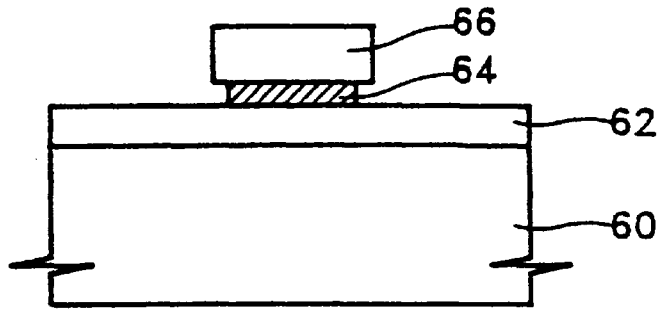

FIG. 21 shows the step of etching the second metal film, in which the second metal film 64 is wet etched using the photoresist pattern 66 as a mask. At this time, the second metal film is sufficiently etched so as to generate an undercut.

Figure 22:
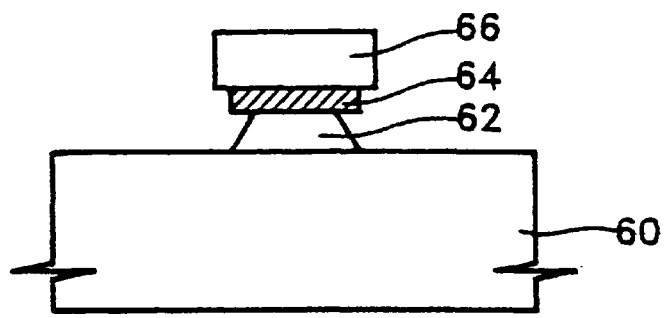

FIG. 22 shows the step of etching the first metal film, in which the undercut is formed in the gate electrode as shown in FIG. 12 when the first metal film 62 is wet etched using the patterned second metal film 64 as a mask.

Figure 23:
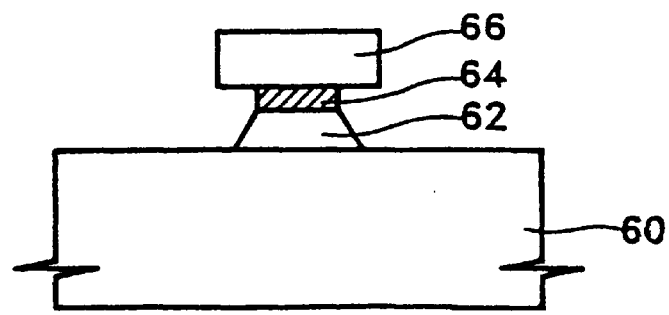

FIG. 23 shows the step of re-etching the second metal film, in which the width of the lower portion of the first metal film 62 becomes wider than that of the second metal film 64 when the patterned second metal metal film 64 is re-etched, thus the undercut of the gate electrode is removed. Here, when etching the first metal film 62 or when re-etching the second metal film 64, baking may be performed on the second metal film 64 after performing the first etching on the second metal film 64, considering the case in which the lifting of the photoresist is generated.

Next, a structure of a TFT substrate using a wiring including an Al or Al alloy as a first metal film and a Mow alloy as a second metal film will now be described specifically with reference to FIGS. 24A, 24B and 25.

Figure 24A:
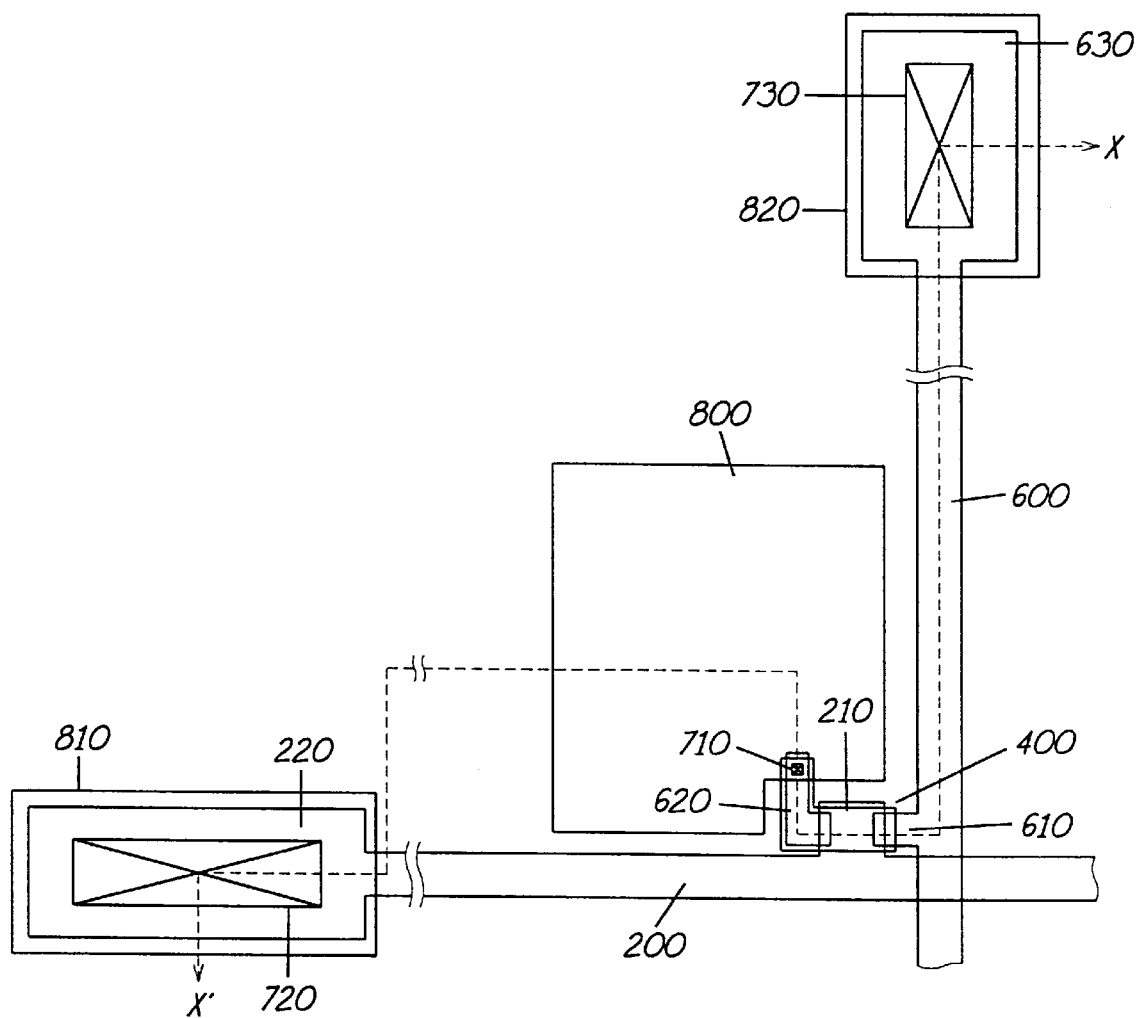
FIG. 24A and 24B show layout views of a TFT substrate according to a fifth embodiment of the present invention.
Figure 24B:
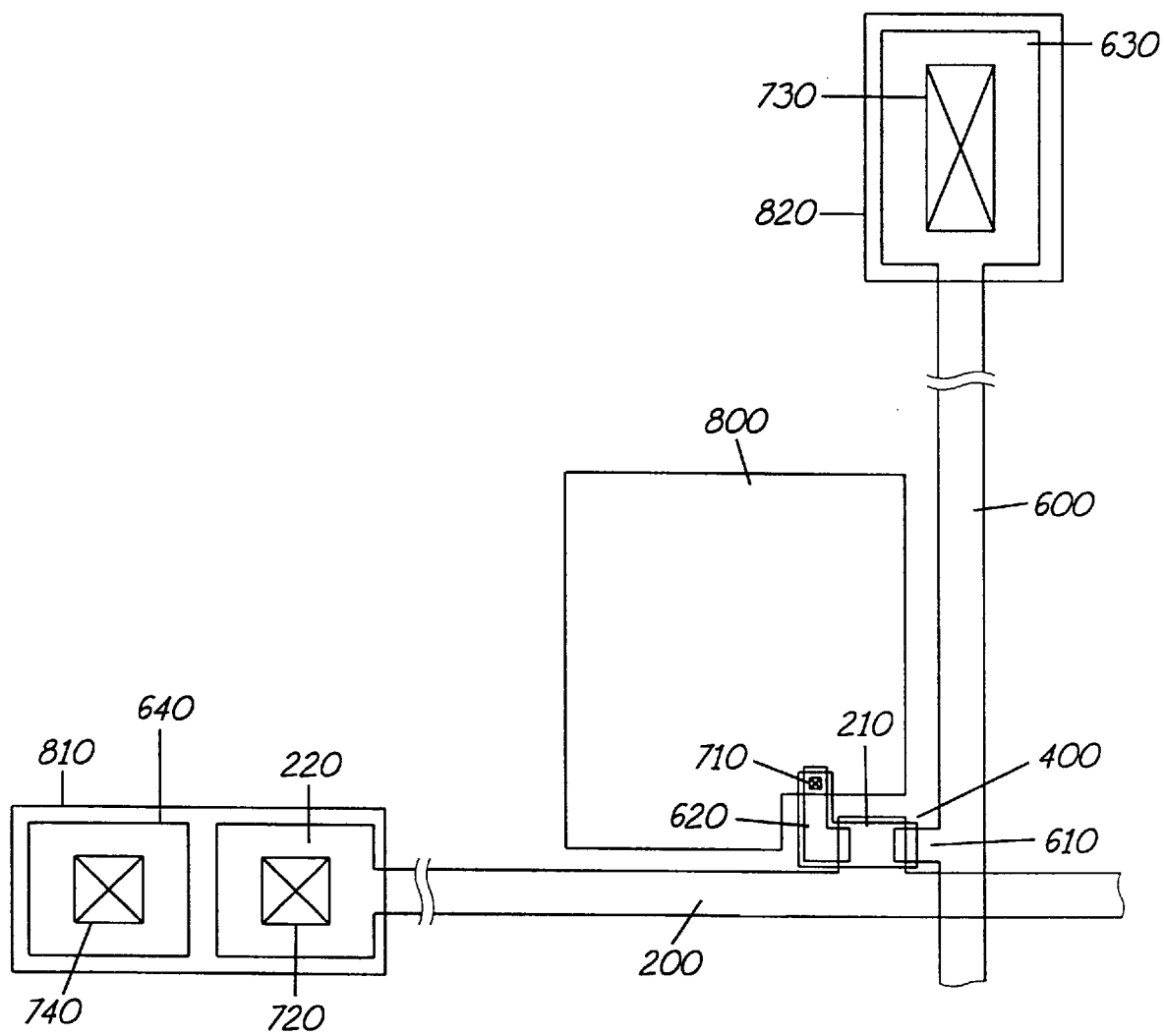
Figure 25:
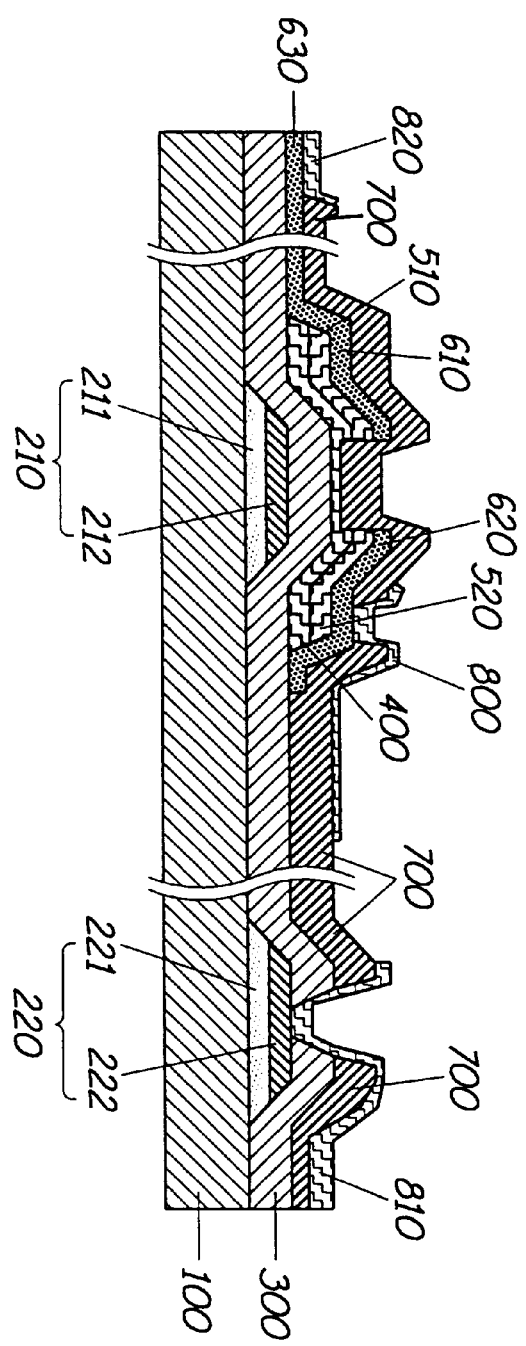
FIG. 25 shows a cross-sectional view taken along the line IIXV–IIXV' in FIG. 24A.

FIG. 24A and 24B show layout views of a TFT substrate according to a fifth embodiment of the present invention, FIG. 25 shows a cross-sectional view taken along the line IIXV–IIXV' in FIG. 24A.

A gate pattern consisting of a gate line 200, a gate electrode 210 which is a branch of the gate line 200 and a gate pad 220 which is connected to the one end of the gate line 200 is formed on a substrate 100. The gate electrode 210 and the gate pad 220 are formed of a first metal film 211 and 221 of Al or Al alloy and a second metal film 212 and 222 of MoW alloy comprising 0.01~20.0 atm % tungsten and the rest of molybdenum, and the gate line 200 is also formed of a dual films of an Al or Al alloy film and MoW alloy film. The gate pad 220 is a path to transmit the scanning signals from the outside to the gate line 200.

A gate insulating film 300 having a contact hole 720 exposing the second metal film 222 of the gate pad 220 covers the gate pattern 200, 210 and 220. A hydrogen amorphous silicon (a-si:H) film 400 and a doped hydrogen amorphous silicon film 510 and 520 with N type impurity are sequentially formed on the portion of the gate insulating film 300 above the gate electrode 210, and the portion 510 of the doped amorphous silicon film is opposite with respect the gate electrode 210.

A data line 600 crossing the gate line 200 is formed on the gate insulating film 300, a data pad 630 for transmitting the image signals from the outside to the data line 600 is connected to the one end of the data line 600. A source electrode 610 which is a branch of the data line 600 is formed on the one portion 510 of the doped amorphous silicon film, and a drain electrode 620 opposite the source electrode 610 with respect to the gate electrode 200 is formed on the other portion 520 of the doped amorphous silicon film 510 and 520. Here, a data pattern including the data line 600, the source and drain electrode 610 and 620, and the data pad 630 is formed of a Mo or Mow alloy film. On the hand, in FIG. 24B, a supplementary gate pad 640 is additionally formed on the gate insulating film 300 nearby the gate pad 210.

A protection film 700 is formed on the data pattern 600, 610, 620 and 630 and portions of the amorphous silicon film 500 which are not covered by the data pattern. The protection 700 have contact holes 710, 720 and 730 exposing the drain electrode 620, the second metal film 222 of the gate pad 220 and the data pad 630, respectively. On the other hand, in FIG. 24B, the protection film 700 has contact hole 740 exposing the supplementary gate pad 640.

Finally, a pixel electrode 800 made of ITO (indium tin oxide) and connected to the drain electrode 602 through a contact hole 710 is formed on the protection film 700. Furthermore, a data ITO film 820 connected to the data pad 630 through the contact hole 730 and transmitting image signals from outside to the data line 600, and a gate ITO film 810 connected to the gate pad 220 through the contact hole 720 and transmitting scanning signals from outside to the gate line 200 are formed on the protection film 700. On the other hand, in FIG. 24B, the gate ITO film 810 extended to the supplementary gate pad 640 to be connected to the supplementary gate pad 640 through the contact hole 740.

As shown in FIGS. 24A and 24B, the portions on which the signals are directly applied are substantially the gate ITO film 810 and the data ITO film 820.

A manufacturing method of a TFT substrate will now be described specifically with reference to the attached drawings.

FIGS. 26A–26D are cross sectional views illustrating a manufacturing method of a TFT substrate shown in FIG. 24A and FIG. 25 using 5 mask according to a fifth embodiment of the present invention.

Figure 26A:
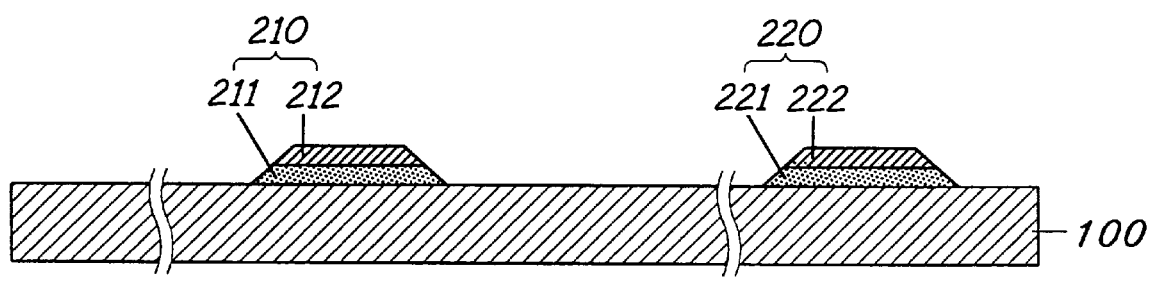
FIGS. 26A–26D show cross sectional views illustrating a manufacturing method of a TFT substrate shown in FIG. 24A according to a fifth embodiment of the present invention.

As shown in FIG. 26A, a first metal film made of either Al and Al alloy with thickness of 1000~5000 Å and the second metal film made of MoW alloy with thickness 200~1500 Å are sequentially deposited on a transparent insulating substrate 100 and patterned to form a gate line 200, a gate electrode 210 and a gate pad 220 using a first mask. As shown in FIG. 26A, the gate electrode 210 and the gate pad 220 are formed of a first metal film 211 and 221 of Al or Al alloy and a second metal film 212 and 222 of MoW alloy, respectively. Although it is not shown FIG. 26A, the gate line 200 is formed of the dual film.

In case of using Al alloy, the Al alloy comprises an Al and both/either a transition metal and/or a rare earth metal of less than 5%. The MoW alloy comprises 0.01~20.0 atm % tungsten and the rest of molybdenum. Preferably, the tungsten content is in the range of 9–11 atm %. An etchant for wet etching the films is an Al etchant such as $CH_3COOH/HNO_3/H_3PO_4/H_2O$, where the density of $HNO_3$ is 8–14%.

It is possible to form the gate pattern 200 to have a sigle-filmed structure made from the group of one selected from Al, Al alloy and MoW alloy.

The dual film made of Al or Al alloy and MoW alloy and the single film made of MoW alloy are etched with taper angle in the range of 30–90°. The above detail explanation is lately described as first experiment.

Figure 26B:
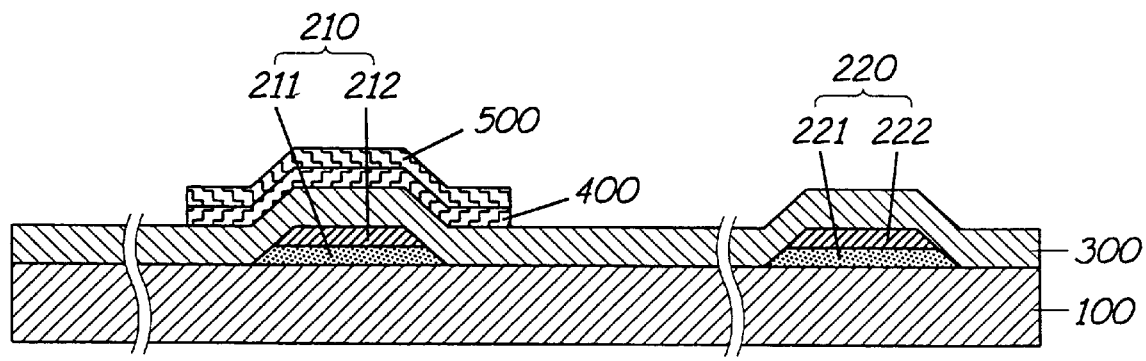

As shown in FIG. 26B, a gate insulating film 300 with thickness of 2,000~10,000 Å made of silicon nitride, a hydrogen amorphous silicon film 400 with thickness of 1,000~3,000 Å and an extrinsic or doped hydrogen amorphous silicon film 500 heavily doped with N type impurity with a thickness of 150~1,500 Å are sequentially deposited, and the amorphous silicon film 400 and the extrinsic amorphous silicon 500 is patterned by photolithography with using a second mask.

Figure 26C:
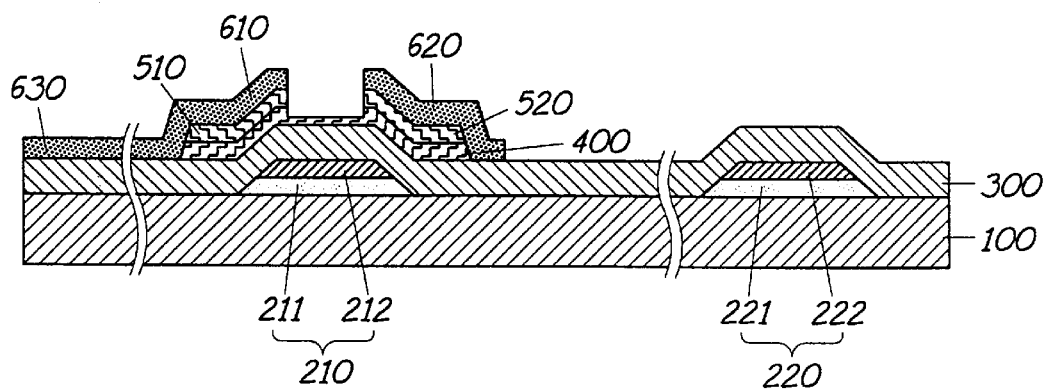

As shown in FIG. 26C, molybdenum (Mo) or MoW alloy film with a thickness of 3,000~20,000 Å is deposited and patterned to form a data pattern including of a data line 600, a source electrode 610, a drain electrode 620, a data pad 630 by photolithography with using a third mask.

In this step, the data pattern may have either a single-filmed structure made of chromium, Mo or MoW or a dual-filmed structure including two films made of Cr, Mo or MoW. In addition the data pattern may further include an Al film or an Al alloy film.

Since the size of the substrate 100 becomes large and pixel density of the display becomes high, it is desirable to reduce the width of wirings. On the other hand, since the wiring has low resistance, the thickness of wirings should increase. Accordingly, the stress of the metal film should not bend the substrate, though the thickness of the metal film increases. The Mo or MoW alloy film gives low stress on the substrate, which will be describe in the second experiment in detail.

Then, the extrinsic amorphous silicon film 500 is etched by using the data pattern 600, 610, 620, and 630 as an etch mask and by using plasma dry etch technique to divide the extrinsic amorphous silicon film 500 into portions 510 and 520 with respect to the gate electrode 210, and to expose the central portion of the amorphous silicon film 400.

Figure 26D:
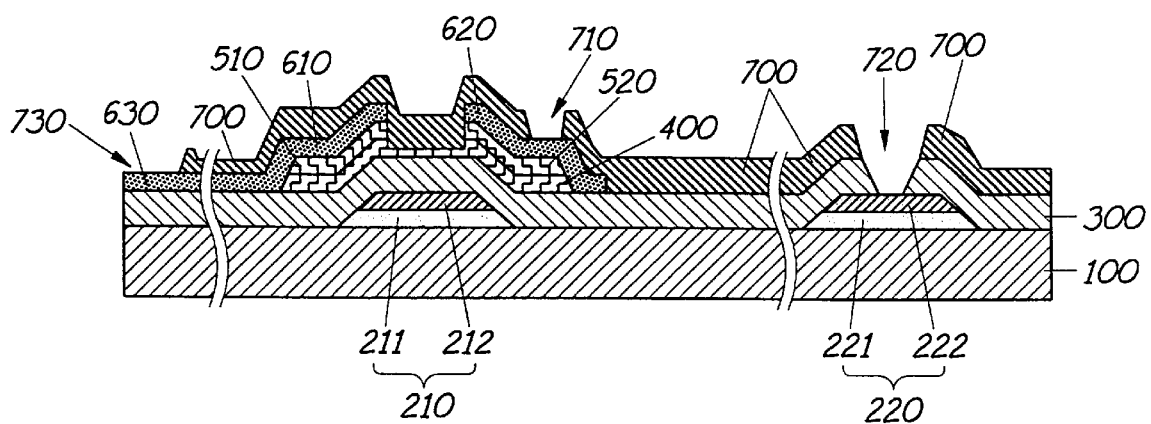

As shown in FIG. 26D, a protection film 700 with thickness of 1,000~10,000 Å is deposited and patterned along with the gate insulating film 300 by photolithography with using a fourth mask to form a contact hole 710 on the drain electrode 620, a contact hole 720 on the upper film 222 of the gate pad 220, and a contact hole 730 on the data pad 630.

As shown in FIG. 24B, a supplementary gate pad 640 may be formed in the step of forming the data pattern, and a contact hole 740 may be formed.

When an aluminum film or an aluminum alloy film is used as an upper film of the data pad, it should eliminated to prevent the film from being in contact with ITO to be deposited subsequently.

Finally, an ITO film with thickness of 300~2,000 Å is deposited and patterned by photolithography with using a fifth mask to form a pixel electrode 800 connected to the drain electrode 620 through contact hole 710, a gate ITO film 810 connected to the gate pad 220 through contact hole 720, and a data ITO film 820 connected to the data pad 630 through contact hole 730, as shown in FIG. 25.

Here, in case of forming the supplementary gate pad 640 and the contact hole 740, the gate ITO film 810 is extended to the supplementary gate pad 640, as shown in FIG. 24B.

it is possible to prevent a battery effect or an oxidation reaction caused by directly contact of Al or Al alloy to the ITO by forming the gate pad 220 in a double structure of Al or Al alloy and Mo or MoW alloy of a refractory metal film.

Next, above mentioned first and second experiment is described in detail.

A first experiment

Figure 27:
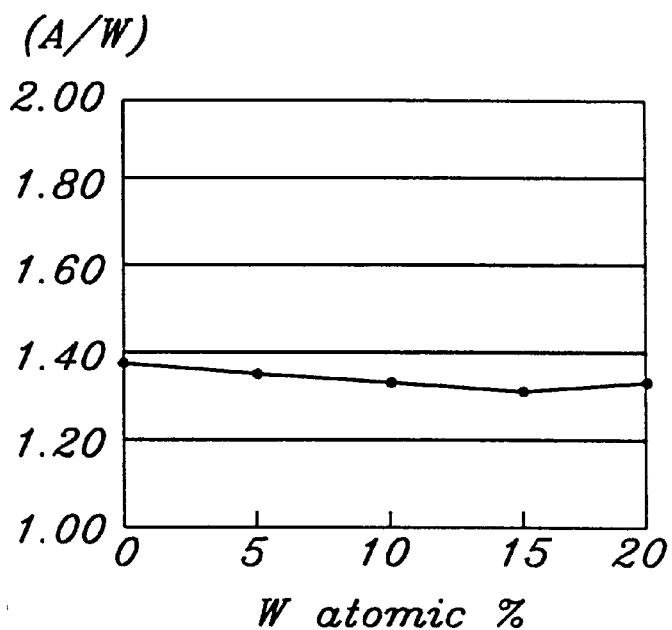
FIGS. 27–29 show graphs of the characteristics of a MoW alloy according to a fifth embodiment of the present invention.
Figure 28:
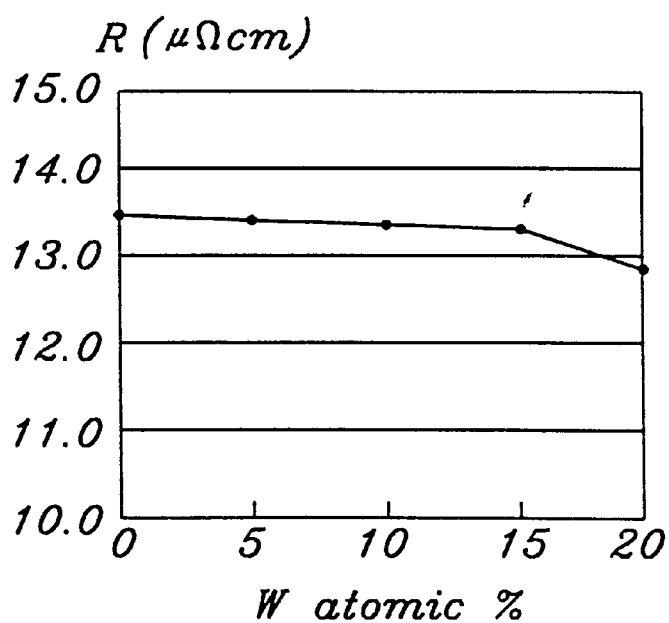
Figure 29:
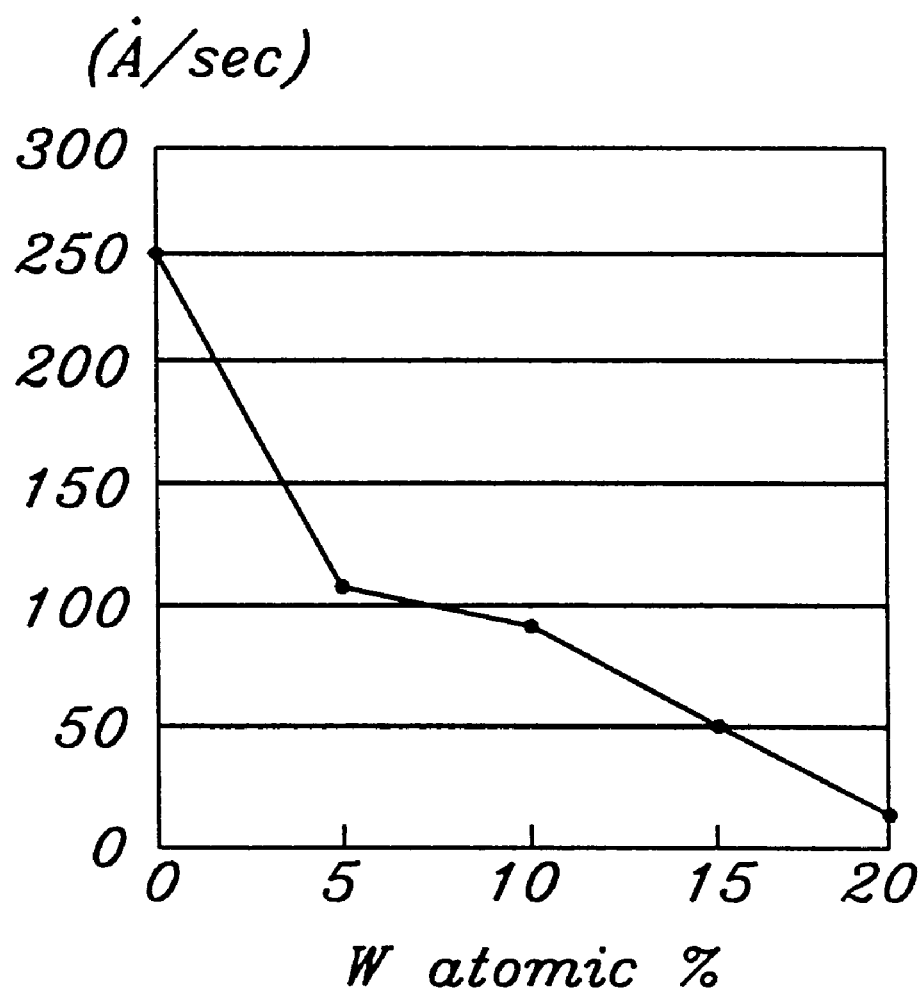

FIGS. 27–29 are the graphs showing the characteristics of a MoW according to an embodiment of the present invention.

FIG. 27 shows a deposition characteristic of a MoW film. The horizontal axis indicates a tungsten content in atm %, and the vertical axis indicates deposited thickness per unit power.

As shown in FIG. 27, the deposited thickness of the MoW film is in the range of 1.20 to 1.40 Å/W.

FIG. 28 shows a resistivity of a MoW alloy according to an embodiment of the present invention, as a function of tungsten content in atm %.

As shown in FIG. 28, the resistivity of the MoW alloy including tungsten content less than 20 atm % is in the range of 12.0 to 14.0 $\mu\Omega$cm.

Since the MoW alloy has a resistivity less than 15 $\mu\Omega$cm as well as a pad property, its singular film can be used as a wiring. It is needless to say that it can be used for a dual-filmed wiring along with a film of aluminum or aluminum alloy. The wiring can be used as a signal line such as a gate line or a data line of a liquid crystal display.

FIG. 29 shows etch rate characteristics of Mo or MoW alloy films according to an embodiment of the present invention, where an etch rate of a MoW alloy film in Å/sec for an etchant for aluminum is shown as a function of a tungsten content in atm %. The etchant used for this embodiment is an aluminum etchant, $CH_3COOH/HNO_3/H_3PO_4/H_2O$.

As shown in FIG. 29, the etch rate of the pure Mo film is high as 250 Å/sec, but the etch rate of the MoW alloy film including tungsten of 5 atm % is 100 Å/sec. Its etch rate when including tungsten of 15 to 20 atm % is less than 50 Å/sec.

Since a thin film of an aluminum or an aluminum alloy has an etch rate in the range of 40–80 Å/sec for $CH_3COOH/HNO_3/H_3PO_4/H_2O$ including $HNO_3$ of 8–14%, the molybdenum alloy film having an etch rate larger than an aluminum film or an aluminum alloy film by 70–100 Å/sec is selected to be used for a dual-filmed wiring along with the aluminum or aluminum alloy film.

Figure 30:
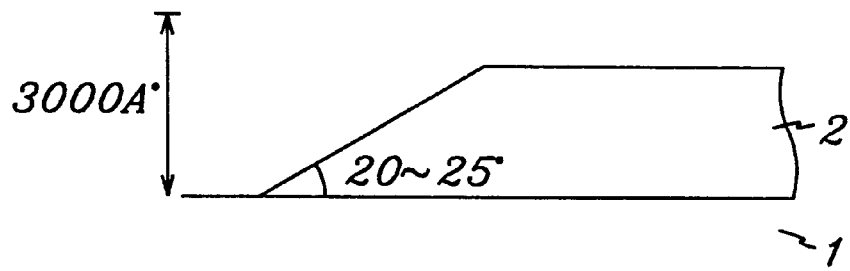
FIG. 30 shows a sectional view of a MoW film according to a fifth embodiment of the present invention.

FIG. 30 is a sectional view of a MoW alloy film etched by an aluminum etchant according to an embodiment of the present invention.

A molybdenum alloy comprising tungsten of 10 atm % is deposited to thickness of 3,000 Å, and etched by an aluminum etchant.

Then, as shown in FIG. 30, a single MoW film has a taper angle of 20°–25°.

In reference to FIG. 30, the etch rate of the molybdenum alloy can be less than 100 Å/sec by adjusting the tungsten content. Then, a taper angle of a single film made from the molybdenum alloy can be formed in the range of 30–90°.

Accordingly, it can be used as a wiring for a gate line and a data line of a liquid crystal display.

FIGS. 31–34 are sectional views of a dual-filmed wiring made of a MoW alloy film and an aluminum alloy film according to an embodiment of the present invention.

As shown in FIGS. 31–34, an Al film or an Al alloy film 3 with thickness of 2,000 Å is deposited on a substrate 1, and a MoW alloy film 2 is deposited to thickness of 1,000 Å on the Al film 3. The Al alloy film 3 and the MoW alloy film 2 are sequentially etched by an Al etchant $CH_3COOH/HNO_3/H_3PO_4/H_2O$, preferably comprising $HNO_3$ of 8~14%.

Here, the aluminum alloy includes an aluminum and a transition metal, such as Ni, Cu, Zr, Nb, Mo, Pd, Hf, Ta or W or a rare earth metal such as Nd, Gd, Dy or Er less than atm 5%.

Figure 31:
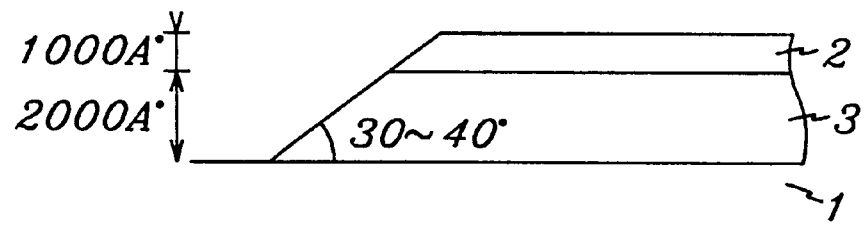
FIGS. 31–34 show sectional views of a dual-filmed wiring made of a MoW film and an aluminum alloy film according to a fifth embodiment of the present invention.
Figure 32:
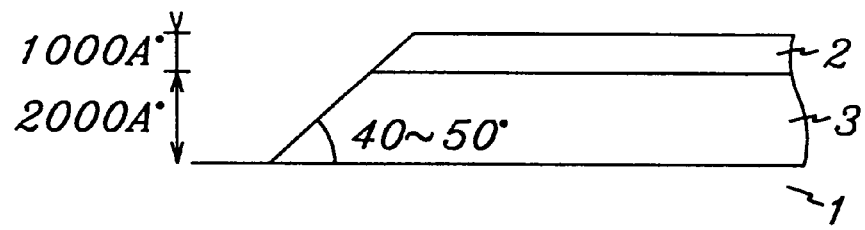
Figure 33:
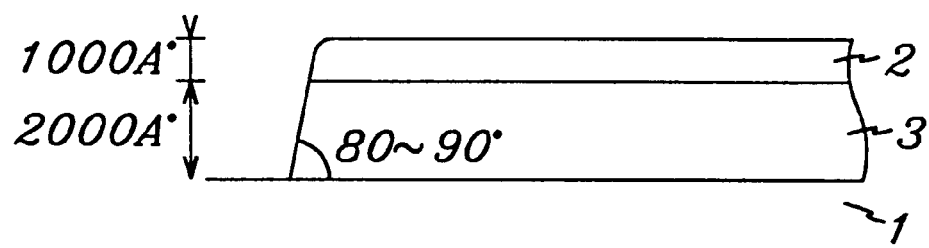
Figure 34:
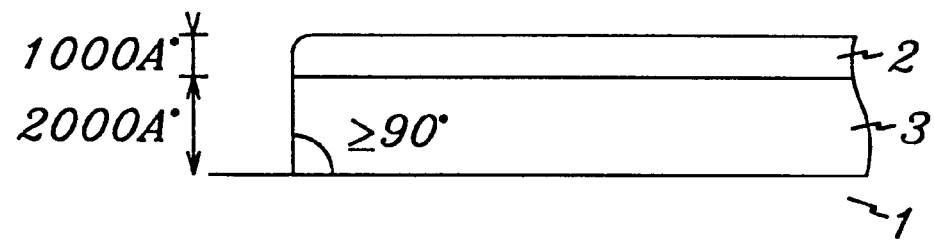

When MoW includes 5 atm % tungsten, the taper angle is in the range of 30–40° as shown in FIG. 31, and when MoW includes 10 atm % tungsten, the taper angle is in the range of 40–50° as shown in FIG. 32. When MoW includes 15 atm % tungsten, the taper angle is in the range of 80–90° as shown in FIG. 33, and when MoW includes 20 atm % tungsten, the taper angle is larger than 90° as shown in FIG. 34.

In addition, there was no spot on the substrate and wiring.

Accordingly, the taper angle of a MoW film including less than 20% tungsten is in the range of 30°–90°, and increases as the tungsten content increases. As shown in FIG. 32, a desirable taper angle, 40~50°, is formed when the tungsten content is in the range of 9~11 atm %.

A second experiment

The second experiment relates to the deposition quality of Mo or MoW alloy. In this experiment, a MoW alloy layer was deposited on a substrate through a sputtering technique using a MoW alloy target including 10 atm % tungsten under the temperature of about 150° C.

Figure 35:
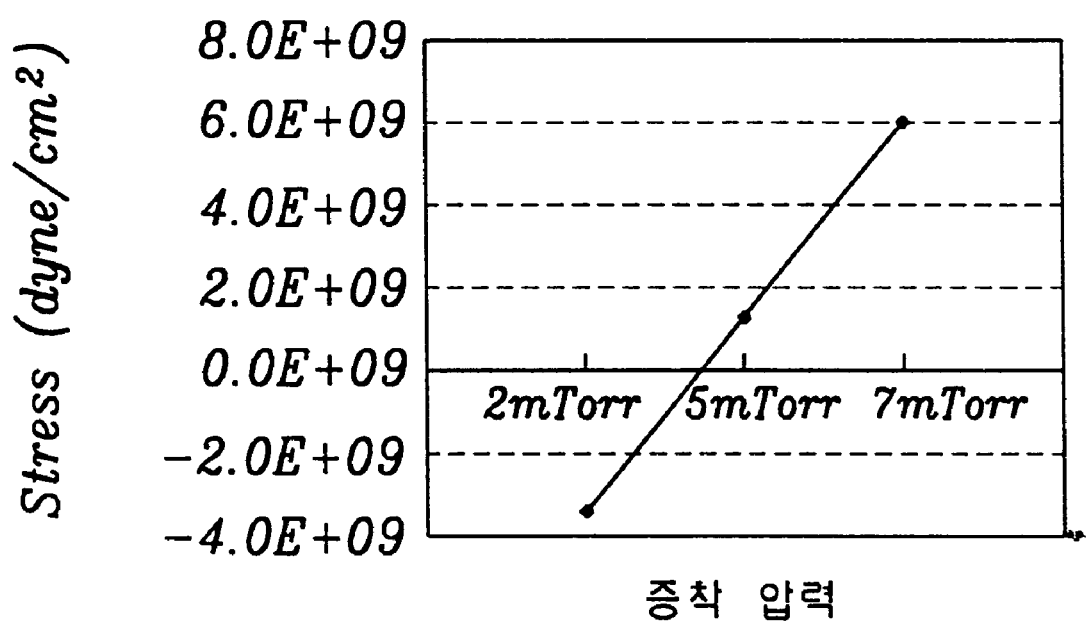
FIG. 35 show graphs of the relation of deposition pressure and stress of a MoW alloy according to a fifth embodiment of the present invention.

FIG. 35 is a graph showing stress of a MoW alloy layer as a function of deposition pressure.

As shown in FIG. 35, the stress of MoW alloy varies from compressive stress to tensile stress in the range of $-3.0*10^9$ to $6.0*10^9$ as the variation of deposition pressure in the range of 2~7 mtorr. Accordingly, it is possible to control the stress of MoW alloy layer by varying deposition pressure, and thus not to bend the substrate when depositing a thick MoW alloy layer. Therefore, wiring made of Mo or MoW may be used the signal lines of the large scale and high resolution liquid crystal display, in particular, more than $370*470$ mm$^2$. The thickness and the width of the wiring is preferably in the range of 0.3~2.0 $\mu$m and 3.0~10 $\mu$m, respectively.

According to the above-mentioned method for manufacturing the liquid crystal display according to the present invention, the gate electrode is formed in a two-filmed-structure of Al or Al alloy and a refractory metal. Therefore, it is possible to prevent a battery effect caused by directly contacting the Al to the ITO and to prevent the generation of a hillock of the Al due to the stress relaxation of the refractory metal. Also, it is possible to reduce the number of photolithography processes, since it is possible to omit the anodizing process due to the refractory metal, to simultaneously etch the insulating film and the protection film, and to form a gate pattern having a taper angle with a etch process in case of using Mo or Mow as a refractory metal with Al or Al alloy.

Since it is possible to form the Al film or Al alloy film formed on the lower area to be identical in size or larger than the refractory metal formed on the upper portion, an undercut is not generated in the gate electrode. Therefore, it is possible to prevent the deterioration of insulation characteristics caused by poor step coverage.

Also, wiring made of Mo or MoW may be used the signal line of the large scale of display device, it is possible to control the width and the thickness of wiring in according to variation of its stress.

The present invention is not restricted to the above embodiments, and it is clearly understood that many variations can be possible within the scope and spirit of the present invention by anyone skilled in the art.

What is claimed is:

1. A method for manufacturing a liquid crystal display, the method comprising the steps of:
    depositing a MoW alloy film including tungsten of 0.01~20.0 atomic percentage, with the rest being molybdenum and inevitable impurities on a substrate;
    forming a gate line, a gate electrode connected to the gate line, and a gate pad connected to the gate line by patterning the MoW alloy film by using an etchant;
    depositing an insulating film;
    forming an un-doped amorphous silicon film and a doped amorphous silicon film;
    forming a data pattern including a data line, a source electrode, a drain electrode, and a data pad connected to the data line;
    etching the doped amorphous silicon film using the data pattern as an etch mask;
    depositing a protection film;
    patterning the protection film along with the insulating film to expose portions of the gate pad, the data pad, and the drain electrode;
    depositing a transparent conductive film; and
    etching the transparent conductive film to form a gate conductive film connected to the gate pad and a pixel electrode connected to the drain electrode.

2. The method for manufacturing a liquid crystal display as claimed in claim 1, further comprising the step of;
    depositing a metal film made of one of Al and an Al alloy under the MoW alloy film; and
    etching the metal film along with the MoW alloy film by using the etchant.

3. The method for manufacturing a liquid crystal display as claimed in claim 2, wherein the metal film comprises Al and one of a transition metal and a rare earth metal at less than 5% atomic percentage.

4. The method for manufacturing a liquid crystal display as claimed in claim 3, wherein the etchant is $CH_3COOH/HNO_3/H_3PO_4/H_2O$.

5. The method for manufacturing a liquid crystal display as claimed in claim 4, wherein the concentration of $HNO_3$ is in the range of 8~14%.

6. The method for manufacturing a liquid crystal display as claimed in claim 1, wherein the data pattern comprises either a single layer of a material selected from the group consisting of Cr, Mo, and a MoW alloy including tungsten, with the rest being molybdenum and inevitable impurities, or a layer having a dual-layered structure of two materials selected from the group consisting of Cr, Mo, and a MoW alloy including tungsten, with the rest being molybdenum and inevitable impurities.

7. The method for manufacturing a liquid crystal display as claimed in claim 6, wherein the data pattern comprises one of a single film of Mo and a MoW alloy, and the size of the substrate is larger than 370*470 $mm^2$.

8. The method for manufacturing a liquid crystal display as claimed in claim 7, wherein the thickness of the data pattern is in the range of 0.3~2.0 $\mu$m.

9. The method for manufacturing a liquid crystal display as claimed in claim 8, wherein the width of the data line is in the range of 3.0~10.0 $\mu$m.

10. A thin film transistor substrate for liquid crystal display comprising:
    a transparent insulating substrate;
    a gate pattern including a gate line, a gate electrode, and a gate pad formed on a transparent substrate and made of a MoW alloy film including tungsten of 0.01~20.0 atomic percentage, with the rest being molybdenum and inevitable impurities;
    a gate insulating film covering the gate pattern;
    an amorphous silicon layer on the gate insulating film;
    a data pattern including a data line, a data pad, and a source and a drain electrode formed on the amorphous silicon film;
    a pixel electrode connected to the drain electrode; and
    a gate conductive film connected to the gate pad.

11. The substrate as claimed in 10, further comprising a conductive layer made of one of Al and an Al alloy under the MoW alloy layer.

12. The substrate as claimed in claim 11, wherein the conductive layer comprises aluminum and one of a transition metal and a rare earth metal of less than 5% atomic weight.

13. The substrate as claimed in claim 10, wherein the data pattern comprises either a single layer of a material selected from the group consisting of Cr, Mo and MoW alloy including tungsten, with the rest being molybdenum and inevitable impurities, or a layer having a dual-layered structure of two materials selected from the group consisting of Cr, Mo and a MoW alloy including tungsten, with the rest being molybdenum and inevitable impurities.

14. The substrate as claimed in claim 13, wherein the data pattern comprises a single layer of one of Mo and a MoW alloy, and the size of the substrate is larger than 370*470 $mm^2$.

15. The substrate as claimed in claim 14, wherein the thickness of the data pattern is in the range of 0.3–2.0 $\mu$m.

16. The substrate as claimed in claim 15, wherein the width of the data line is in the range of 3.0~10.0 $\mu$m.

* * * * *